(12) United States Patent
Isaksen et al.

(10) Patent No.: US 7,161,989 B1
(45) Date of Patent: Jan. 9, 2007

(54) CIC QAM MODULATOR

(75) Inventors: David Bruce Isaksen, Mountain View, CA (US); Mark Fong, San Jose, CA (US)

(73) Assignee: WideBand Semiconductors, Inc., Mountain View, CA (US)

(*) Notice: Subject to any disclaimer, the term of this patent is extended or adjusted under 35 U.S.C. 154(b) by 721 days.

(21) Appl. No.: 10/402,788

(22) Filed: Mar. 29, 2003

(51) Int. Cl.
H04L 27/04 (2006.01)

(52) U.S. Cl. .................. 375/295; 375/296; 375/298

(58) Field of Classification Search ............... 375/219, 375/220, 222, 295, 298, 259, 260, 261, 296; 370/206, 207; 455/91, 108; 332/103
See application file for complete search history.

(56) References Cited

U.S. PATENT DOCUMENTS

| | | | |
|---|---|---|---|
| 5,553,064 A | * | 9/1996 | Paff et al. .................. 370/478 |
| 5,920,808 A | * | 7/1999 | Jones et al. ................ 455/127.1 |
| 6,175,389 B1 | | 1/2001 | Felts, III et al. |
| 6,973,141 B1 | * | 12/2005 | Isaksen et al. ............... 375/308 |

* cited by examiner

*Primary Examiner*—Dac Ha
*Assistant Examiner*—Jaison Joseph
(74) *Attorney, Agent, or Firm*—Boris G. Tankhilevich

(57) ABSTRACT

An apparatus for modulating a digital input signal having a pre-assigned symbol rate and having a baseband carrier frequency by using a single sample clock signal. The pre-assigned symbol rate is selected from the group consisting of a plurality of symbol rates. The apparatus in a baseband mode comprises: (a) an Interpolate_by_2_Nyquist Filter block configured to double the pre-assigned symbol rate, to perform Nyquist filtering operation, and configured to output an Inphase (I) and a Quadrature (Q) components of the pre-assigned signal having the double symbol rate; (b) a Complex Shaper block configured to pre-compensate the spectrum of I and Q components of the signal having the double symbol rate in advance for a spectrum distortion caused by the apparatus; ©️ a Cascaded Integrated Comb (CIC) Interpolator filter configured to increase by an interpolation R factor the sample rate of the signal as compared with a sample rate of the baseband carrier; (d) a Phase Shifter configured to compensate a phase of interpolated by R signal for a known quadrature error; (e) an Inphase (I) channel and Quadrature (Q) channel Gain blocks configured to pre-compensate the I and Q components of the interpolated by R signal for a known gain difference circuit between the I and Q channel gains; (f) an I and Q channel DC offset blocks configured to pre-compensate I and Q components of the interpolated by R signal for a known DC offset difference circuit between I and Q channel DC offset blocks; and (g) a Controller block configured to supply a plurality of control signals to the apparatus. In the passband mode, I and Q channel Gains are set to one, and I and Q channel DC offsets are set to zero.

20 Claims, 13 Drawing Sheets

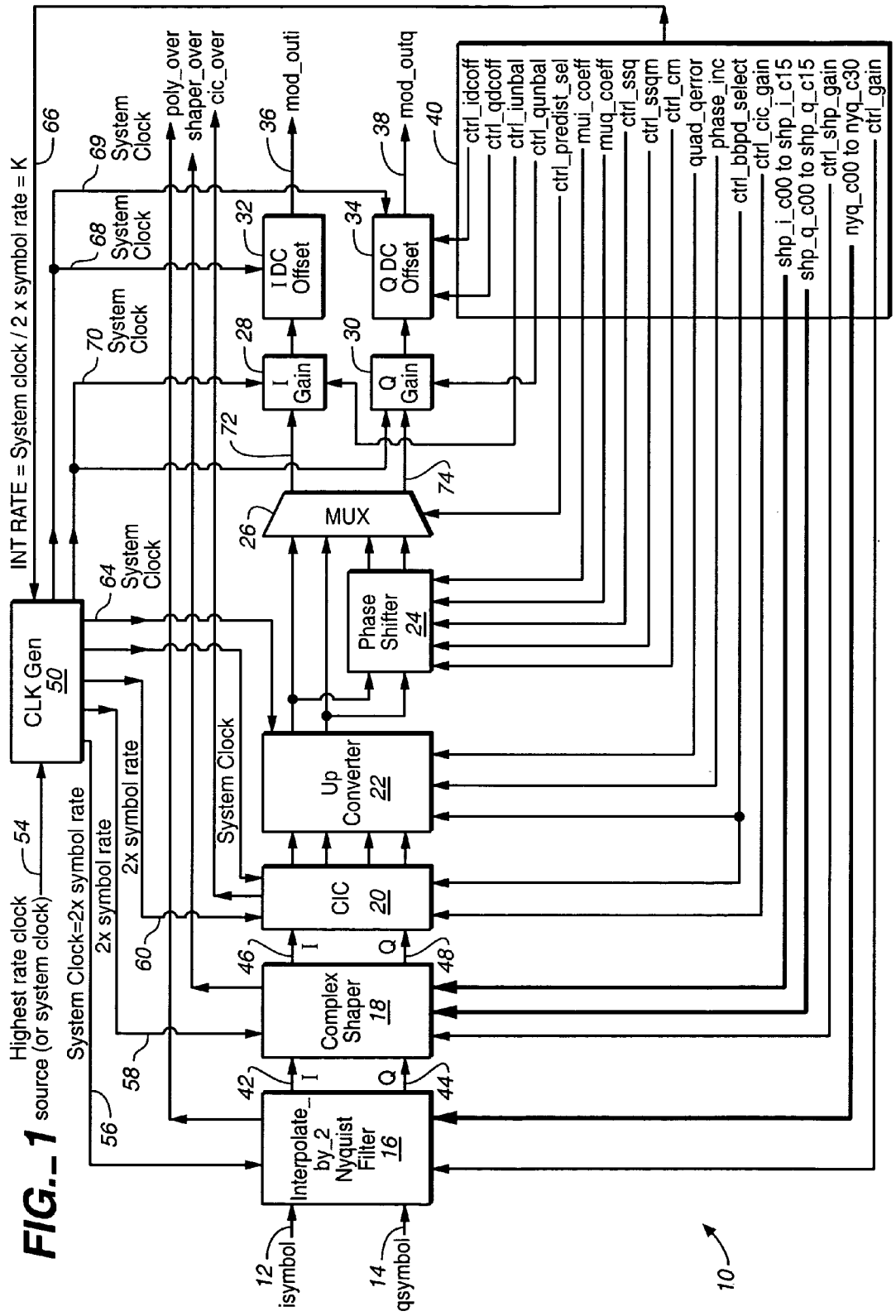

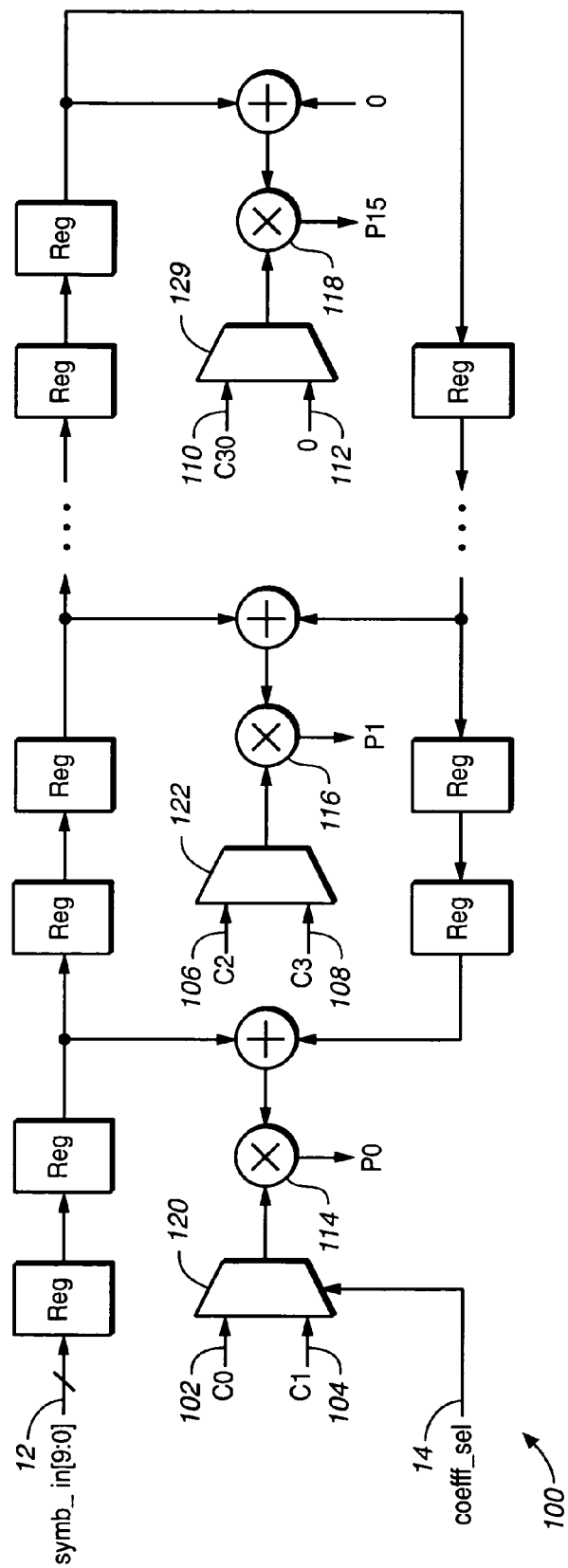
FIG._2
I section of Interpolator by 2 Nyquist Filter

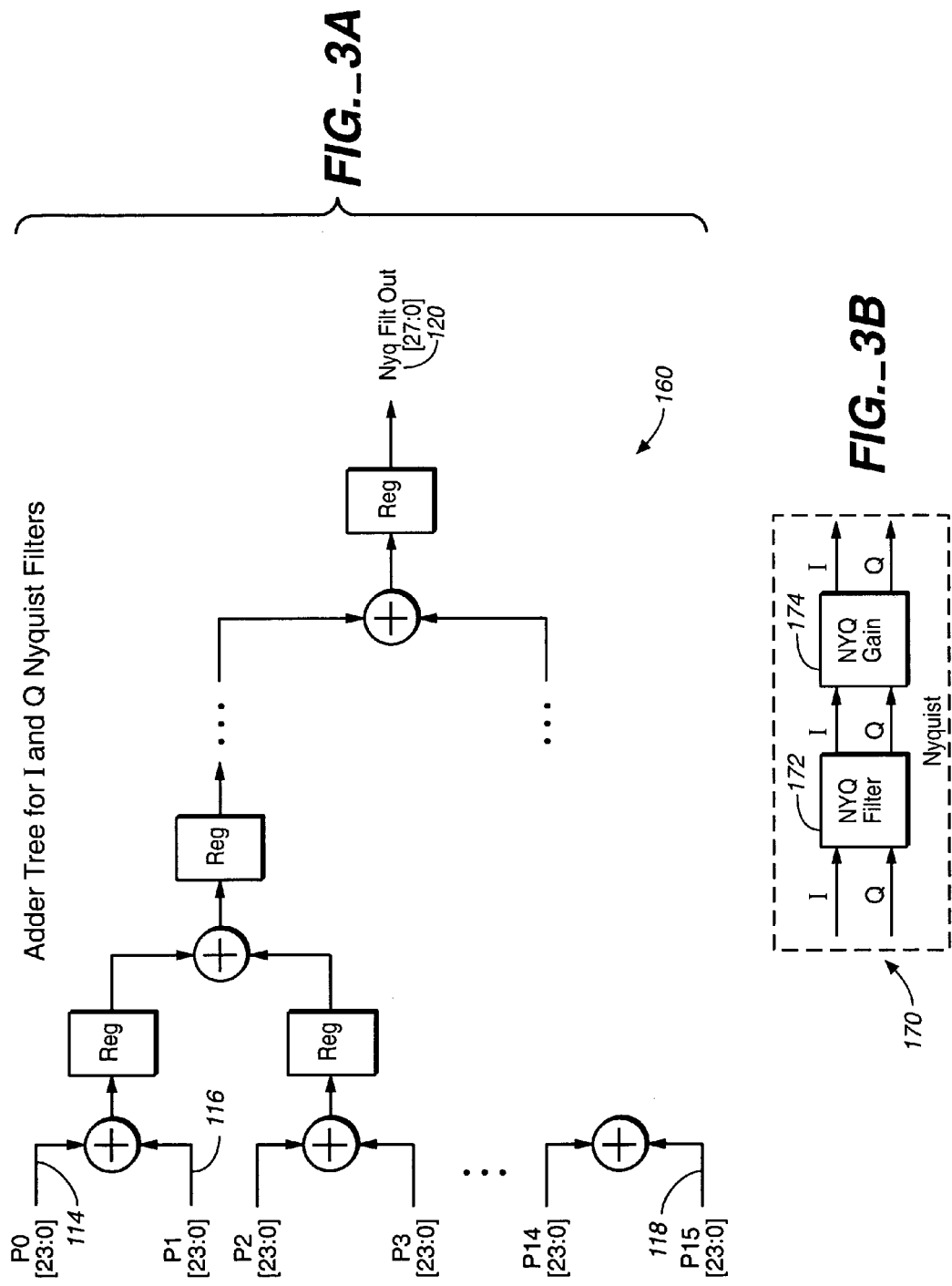

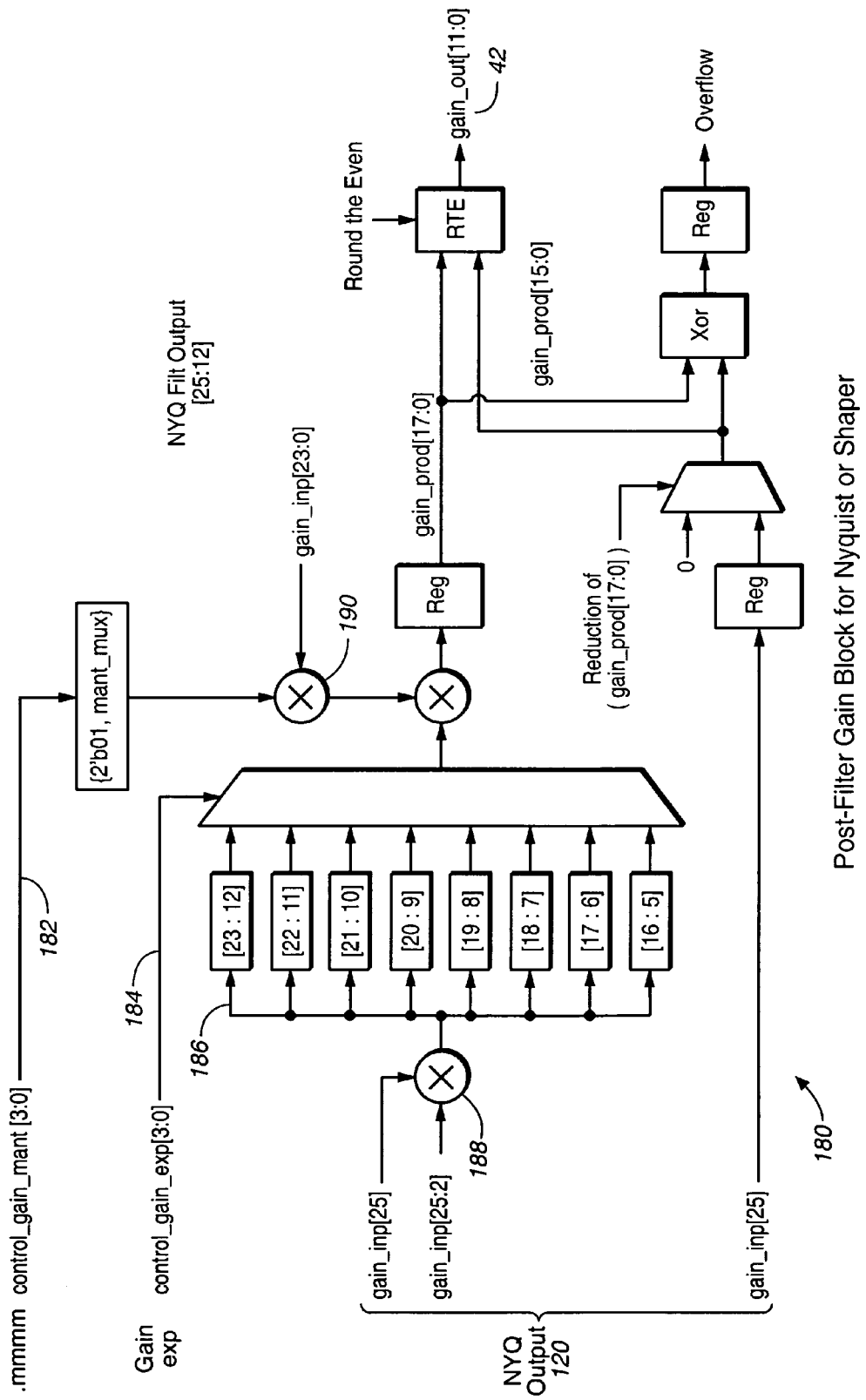
FIG._4

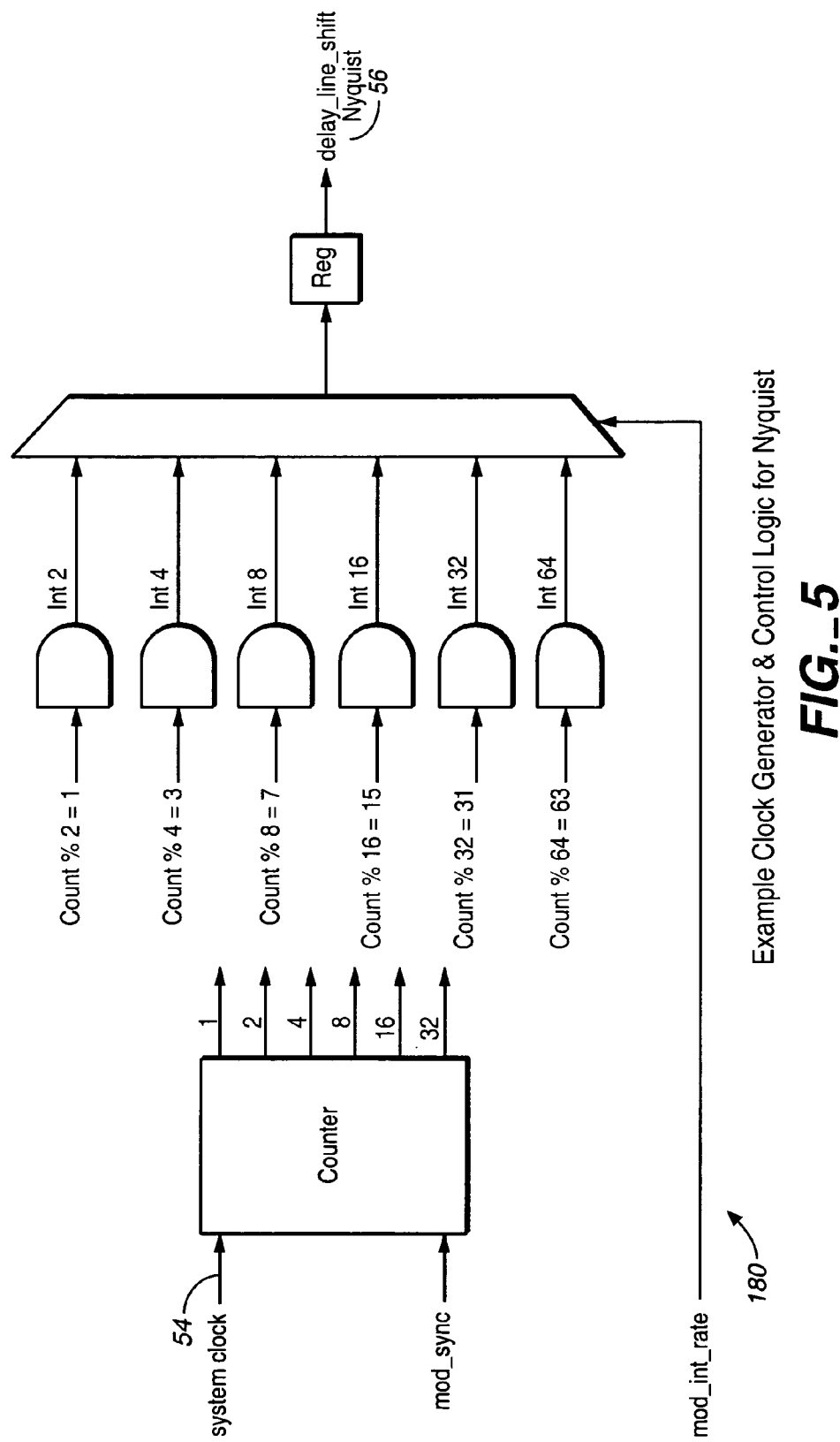

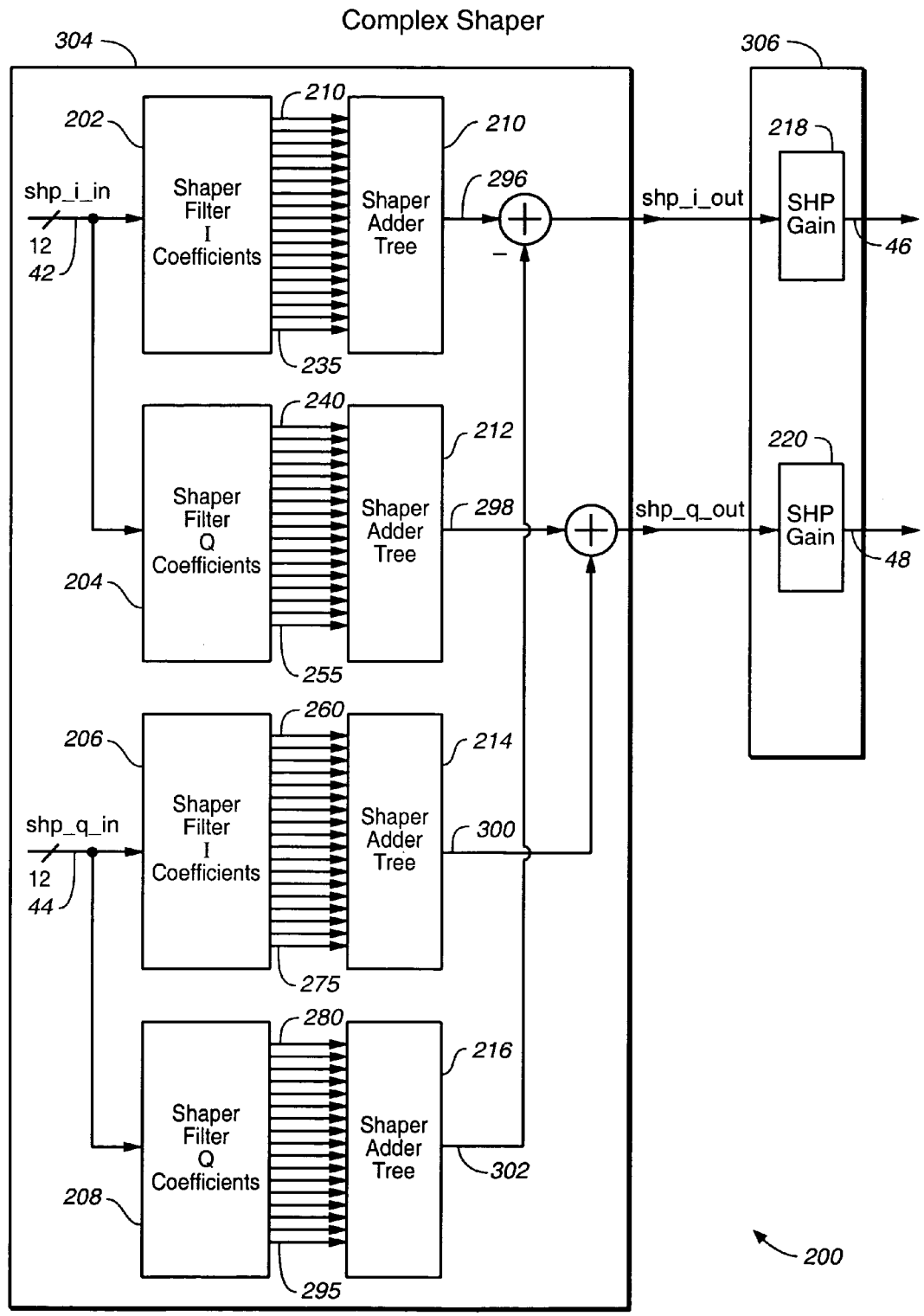
FIG._6

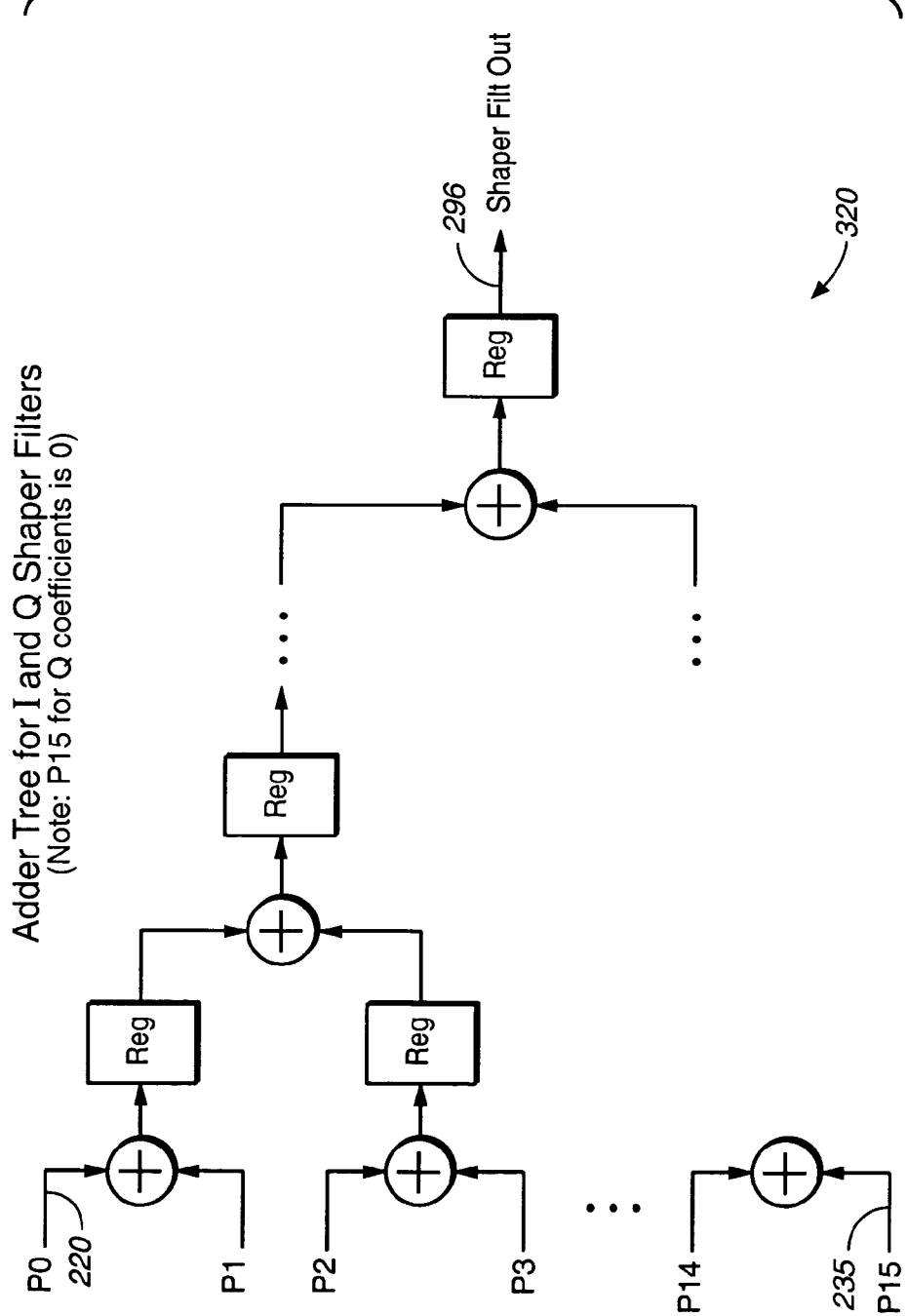
FIG._7

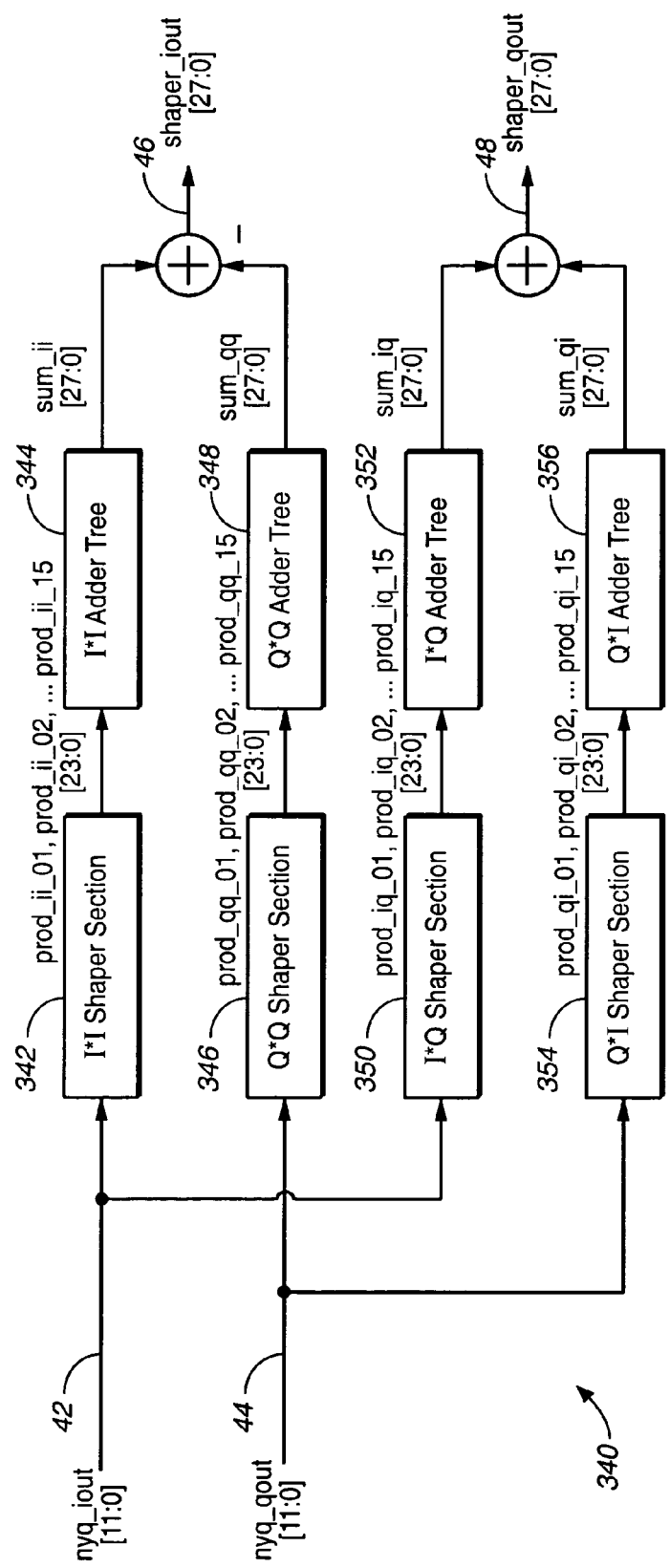
FIG._8

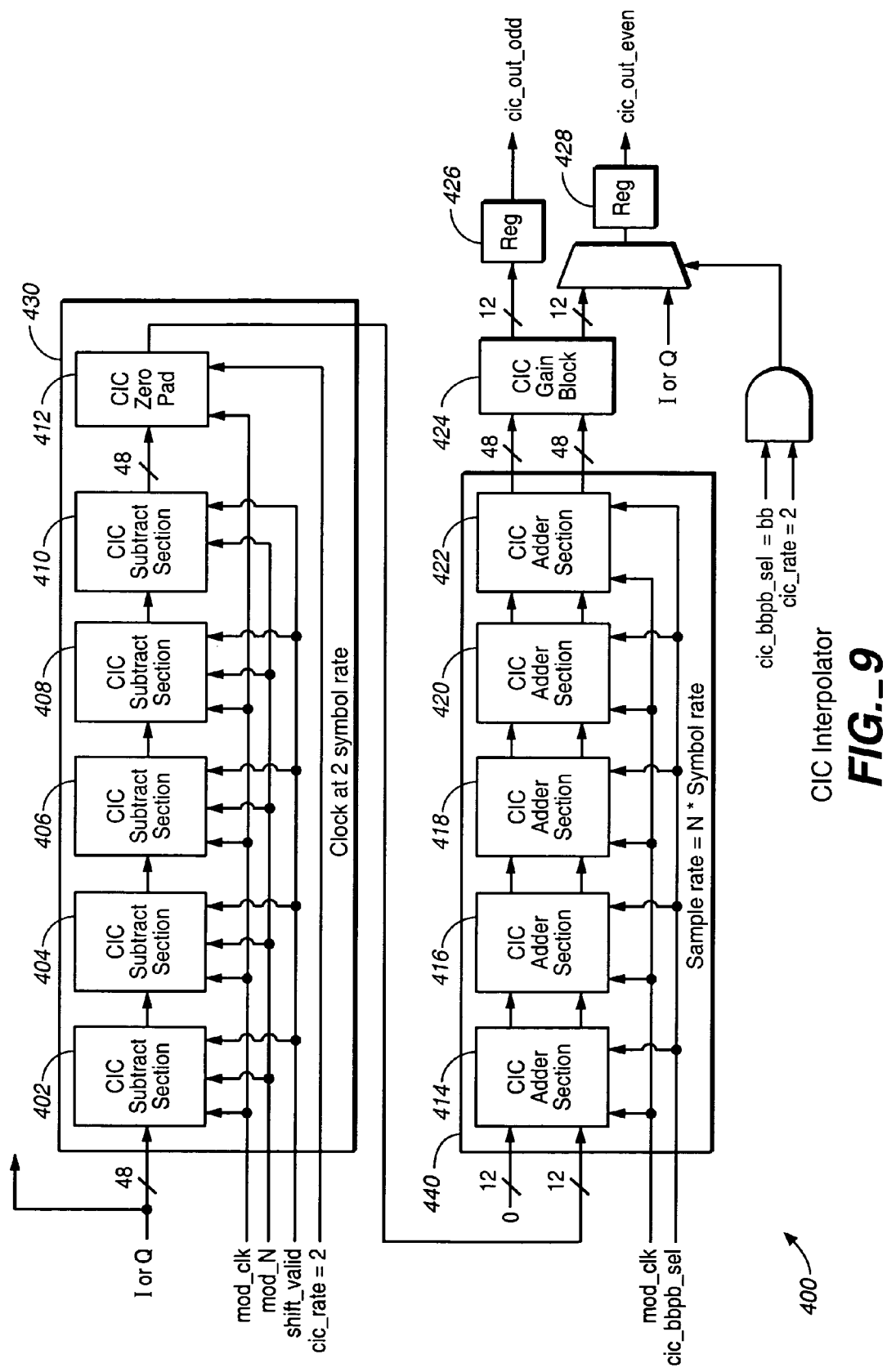
FIG._9

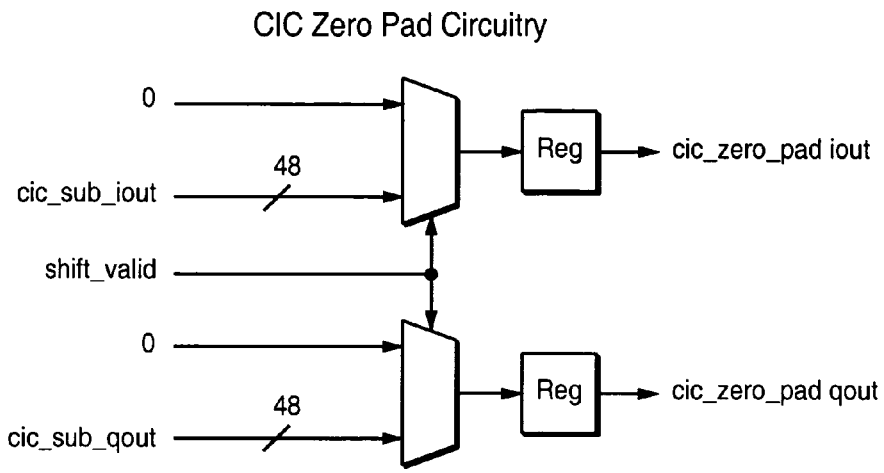
FIG._10
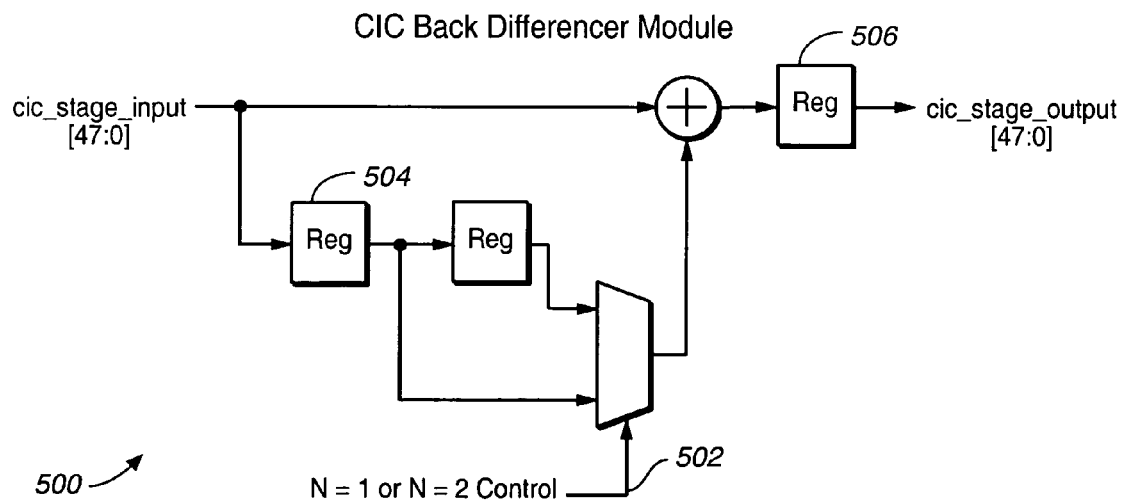
The registers are clocked at twice the symbol rate
(same clock valid as the predistorter, and shaper stages)
FIG._11

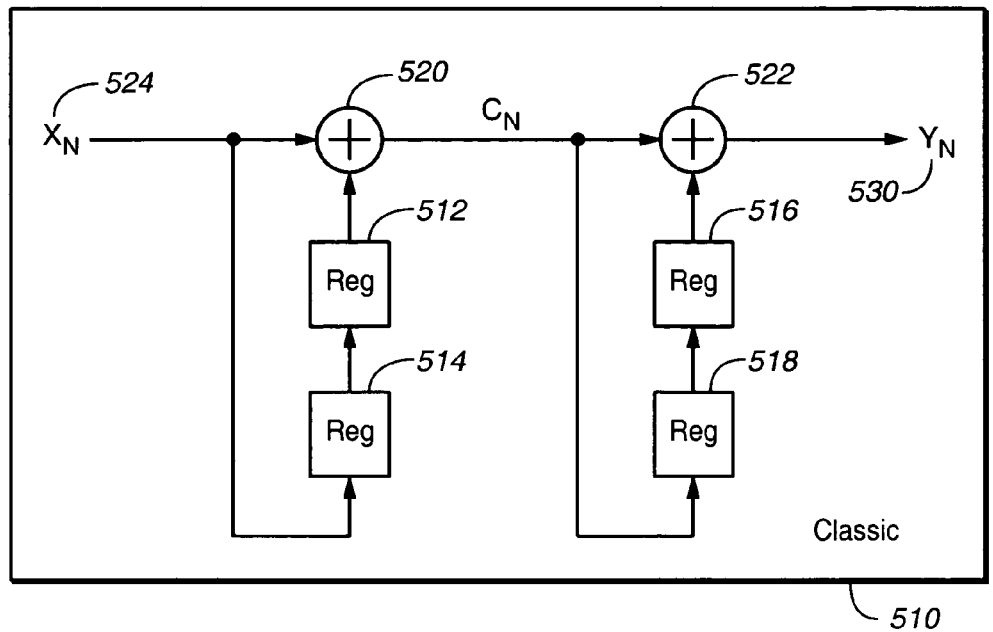
FIG._12
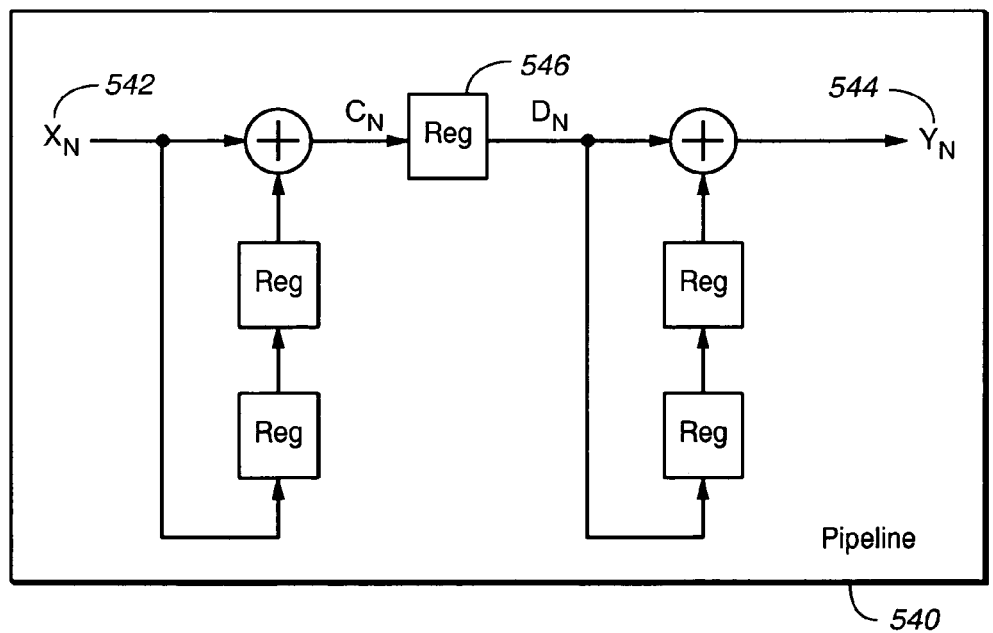
FIG._13

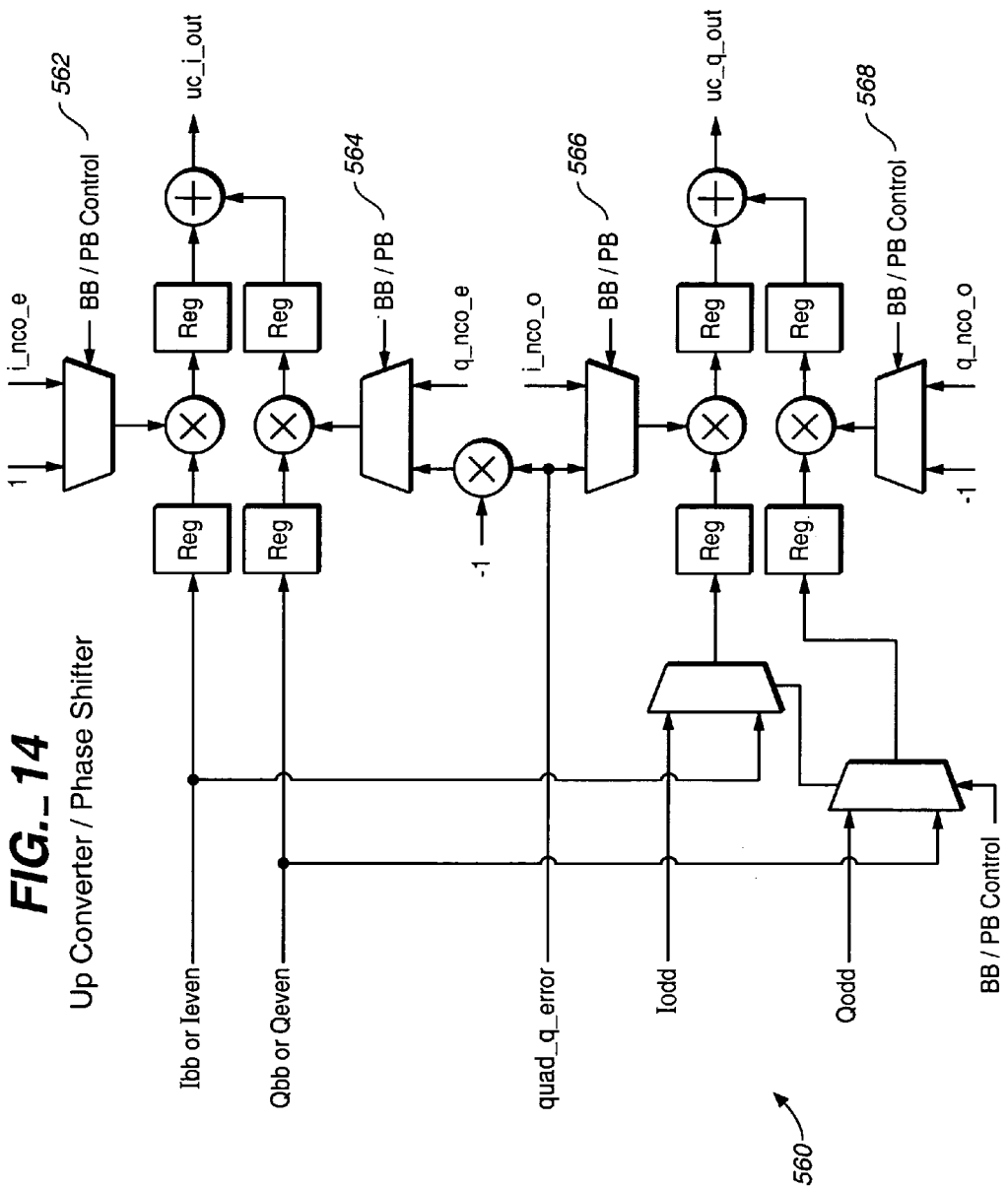
FIG._ 14
Up Converter / Phase Shifter

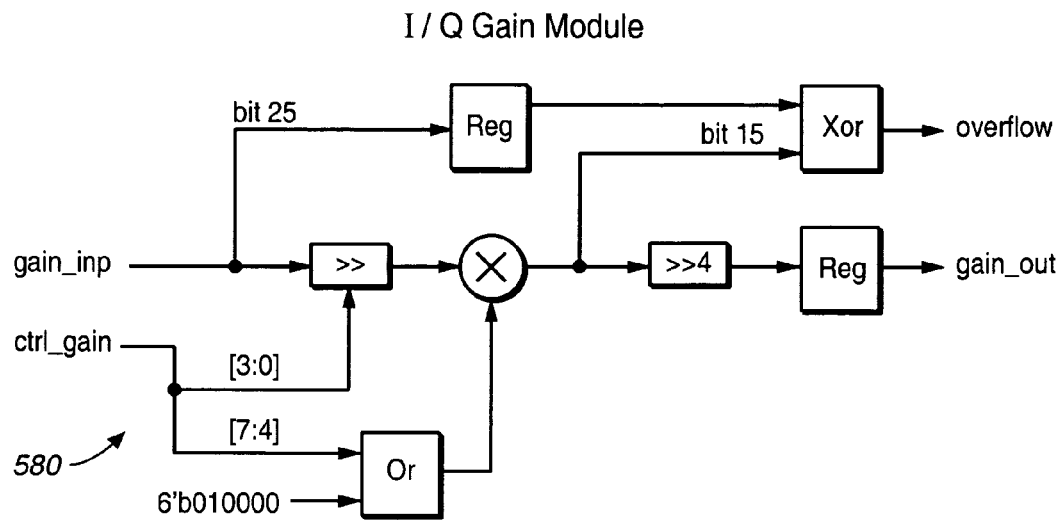
FIG._15
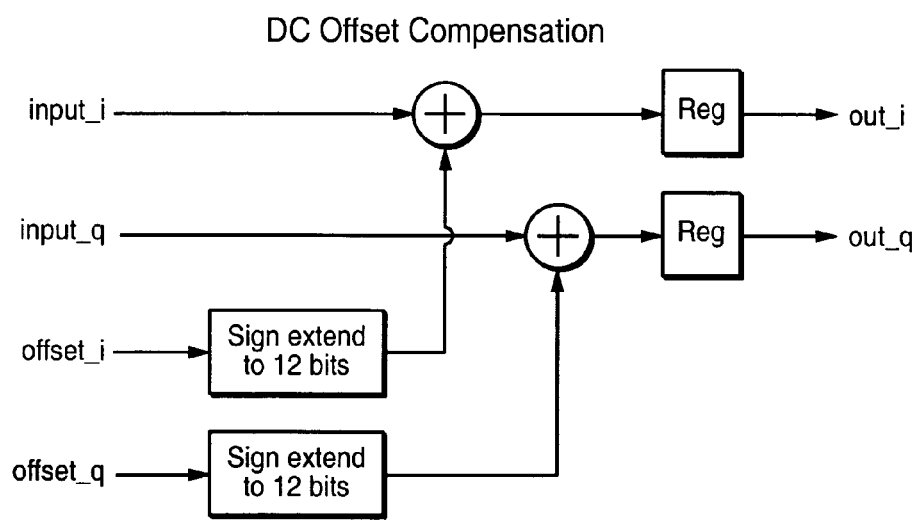
FIG._16

US 7,161,989 B1

CIC QAM MODULATOR

BACKGROUND OF THE INVENTION

1. Field of the Invention

The present invention relates to the field of the digital signal processing, and more specifically, to the field of digital modulators.

2. Discussion of the Prior Art

When a plurality of symbol rates are used by transceivers of digital signals, each transceiver should be capable of multi-rate operations with different symbols rates. However, if each digital modem utilizes different sample clock signals, the modem architecture involves complicated analog components, and the speed and quality of signal demodulation is not optimized.

What is needed is to design a digital modem that allows multi-rate operations with different symbol rates, but that utilizes a single sample clock signal, thus reducing the complexity of analog components and increasing the speed of signal acquisition and signal processing.

SUMMARY OF THE INVENTION

To address the shortcomings of the available art, the present invention provides for a digital modem that allows multi-rate operations with different symbol rates, but that utilizes a single sample clock signal.

One aspect of the present invention is directed to an apparatus configured to modulate in a baseband mode a digital input signal having a pre-assigned symbol rate and having a baseband carrier frequency by using a single sample clock signal. The pre-assigned symbol rate is selected from the group consisting of a plurality of symbol rates.

In one baseband mode embodiment, the apparatus of the present invention comprises: (1) an Interpolate_by_2_Nyquist Filter block configured to double the pre-assigned symbol rate, configured to perform Nyquist filtering operation on the pre-assigned signal having the double symbol rate, and configured to output an Inphase (I) component and a Quadrature (Q) component of the pre-assigned signal having the double symbol rate; (2) a Complex Shaper block configured to pre-compensate the spectrum of the Inphase (I) component and of the Quadrature (Q) component of the signal having the double symbol rate in advance for a spectrum distortion caused by the apparatus; (3) a Cascaded Integrated Comb (CIC) Interpolator configured to increase by an interpolation R factor the sample rate of the signal as compared with a sample rate of the baseband carrier, and configured to output an Inphase (I) component and a Quadrature (Q) component of the interpolated by the factor R signal, whereas R is an integer; (4) a Phase Shifter configured to compensate phase of the interpolated by R signal for a known quadrature error; (5) an Inphase (I) channel Gain (I_Gain) block and a Quadrature (Q) channel Gain (Q_Gain) block configured to pre-compensate the I component and the Q component of the interpolated by R signal for a known gain difference between the I channel gain and the Q channel gain; (6) an I channel DC offset (I_DC_Offset) block and a Q channel DC offset (Q_DC_Offset) block configured to pre-compensate the I component and the Q component of the interpolated by R signal for a known DC offset difference between the I channel DC offset and the Q channel DC offset; and (7) a Controller block configured to supply a plurality of control signals to the apparatus of the present invention.

In one embodiment of the present invention, the CIC Interpolator filter further comprises a programmable CIC Interpolator filter including a set of programmable CIC Interpolator parameters configured to optimize the interpolation rate R.

In one embodiment of the present invention, the Complex Shaper block further comprises a programmable Complex Shaper block further including a Complex Finite Impulse Response (FIR) filter including a set of programmable FIR filter coefficients.

In one embodiment of the present invention, the programmable Complex Finite Impulse Response (FIR) filter further includes a Finite Impulse Response (FIR) filter in the I channel (I_FIR) and a Finite Impulse Response (FIR) filter in the Q channel (Q_FIR). In this embodiment, the I_FIR filter includes two L sets of taps and two L sets of complex coefficients: a first L set of I_I complex coefficients and a second L set of I_Q complex coefficients. L is an integer. In this embodiment, the Q_FIR filter also includes two L sets of taps and two L sets of complex coefficients: a first L set of Q_I complex coefficients and a second L set of Q_Q complex coefficients. In one embodiment, the I channel coefficients and the Q channel coefficients are symmetrical. In one embodiment, each I_I channel coefficient is equal to one Q_Q channel coefficient, and each I_Q channel coefficient is equal to one Q_I channel coefficient.

In one embodiment of the present invention, the CIC Interpolator further includes a plurality of CIC difference circuits, and a plurality of Comb filters. In one embodiment of the present invention, the CIC Interpolator further includes: (a) an integer K-stage difference circuit further including an integer N of registers, and a substracter; and (b) a zero pad block. In one embodiment of the present invention, the CIC Interpolator further includes: ©) at least one Comb filter further including an integer M-section cascaded comb filter; and (d) a gain block. In one embodiment, each section of the M-section cascaded comb filter further includes an integer N of registers, and an adder. In one embodiment, the number M of sections in the M-section cascaded comb filter is equal to the number K of stages in the K-stage difference circuit.

In one embodiment of the present invention, the CIC Interpolator further includes a plurality of pipeline registers. Each pipeline register is configured to perform a pipeline computation on a plurality of input symbols in order to increase the speed of operation of the CIC Interpolator.

In one embodiment of the present invention, the I_DC_Offset block is configured to output an I component of the demodulated input signal in the I channel, whereas the Q_DC_Offset block is configured to output a Q component of the demodulated input signal in the Q channel.

Another aspect of the present invention is directed to an apparatus configured to modulate in a passband mode a digital input signal having a pre-assigned symbol rate and having a baseband carrier frequency by using a single sample clock signal. The pre-assigned symbol rate is selected from the group consisting of a plurality of symbol rates.

In one passband mode embodiment, the apparatus of the present invention comprises: (1) an Interpolate_by_2_Nyquist Filter block configured to double the pre-assigned symbol rate, configured to perform Nyquist filtering operation on the pre-assigned signal having the double symbol rate, and configured to output an Inphase (I) component and a Quadrature (Q) component of the pre-assigned signal having the double symbol rate; (2) a Complex Shaper block configured to pre-compensate the spectrum of the Inphase (I) component and of the Quadrature (Q) component of the signal having the double symbol rate in advance for a spectrum distortion caused by the apparatus of the present invention; (3) a Cascaded Integrated Comb (CIC) Interpolator filter configured to increase by an interpolation 2R factor the sample rate of the signal as compared with a sample rate of the baseband carrier, and configured to output an Inphase (I) component and a Quadrature (Q) component of the interpolated by 2R signal; (4) an UP_Converter configured to up convert the complex interpolated by 2R signal to a complex signal having an intermediate frequency, and configured to output a real signal having the intermediate frequency; and (5) a Controller block configured to supply a plurality of control signals to the apparatus of the present invention. In this embodiment, the Inphase channel Gain is set to be equal to one; the Quadrature channel Gain is set to be equal to one; the I channel DC offset is set to be equal to zero; and the Quadrature channel DC offset is set to be equal to zero.

BRIEF DESCRIPTION OF DRAWINGS

The aforementioned advantages of the present invention as well as additional advantages thereof will be more clearly understood hereinafter as a result of a detailed description of a preferred embodiment of the invention when taken in conjunction with the following drawings.

FIG. 1 depicts the apparatus of the present invention configured to modulate in a baseband mode or/and in a passband mode a digital input signal having a pre-assigned symbol rate and having a baseband carrier frequency by using a single sample clock signal.

FIG. 2 illustrates the Inphase section of the Interpolate_by_2_Nyquist Filter block of the present invention.

FIG. 3A shows an adder tree for I Nyquist Filters (of FIG. 2) and for Q Nyquist Filters of the present invention.

FIG. 3B illustrates the Nyquist filter comprising a Filter block and a Post-Filter Gain block.

FIG. 4 depicts the Post-Filter Nyquist Gain block of FIG. 3B in more details

FIG. 5 shows the Clock Generator and Nyquist Delay Line Shift Logic of the present invention.

FIG. 6 depicts the Complex Shaper Filter of the present invention further including a Filter Block and a Gain Block.

FIG. 7 illustrates a single Shaper Adder in more details.

FIG. 8 shows the Filter block of the Complex Shaper filter in more details.

FIG. 9 depicts the CIC Interpolator block as a part of the apparatus of FIG. 1 of the present invention in more details.

FIG. 10 illustrates the zero pad block of the CIC Interpolator of FIG. 9 in more details.

FIG. 11 shows the Back difference circuit module of the CIC Interpolator of FIG. 9 in more details.

FIG. 12 illustrates the conventional design of the difference circuit.

FIG. 13 depicts the design of the difference circuit with latency that is used in the present invention.

FIG. 14 shows the Programmable UP_Converter (Phase Shifter) of the present invention in more details.

FIG. 15 illustrates the I/Q Gain block in more details.

FIG. 16 depicts the DC Offset compensation block.

DETAILED DESCRIPTION OF THE PREFERRED AND ALTERNATIVE EMBODIMENTS

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

FIG. 1 depicts the apparatus 10 of the present invention configured to modulate in a baseband mode or/and in a passband mode a digital input signal including an Inphase (I) component 12 and a Quadrature (Q) component 14, having a pre-assigned symbol rate, and having a baseband carrier frequency by using a single sample clock signal.

In the prior art implementation of an apparatus (not shown) for processing a digital input signal having a variable symbol rate, one has to use a synthesizer (not shown) to generate a proper clock signal for each input signal depending on the symbol rate to achieve the preferred (sample per symbol) ratio which is between (4–8) (samples per symbol) for a passband mode or (2–4) samples per symbol for a baseband mode. The apparatus 10 of the present invention is a simpler circuit than a prior art circuit because it utilizes a single system clock for modulating a digital input signal having a variable symbol rate without using a synthesizer which is an expensive device that is difficult to build.

More specifically, referring still to FIG. 1, the apparatus 10 of the present invention, in both PB and BB modes, further comprises a Clock Generator block 50. The Clock Generator block 50 using the input signal from the highest rate clock source 54, and the interpolate rate R signal 66 (equal to the highest system clock rate divided by double symbol rate) from the controller block 40, generates a system clock 56 for each particular element of the circuit 10. More specifically, for the Interpolate_by_2 Nyquist Filter block 16 the clock 56 is equal to 2× symbol rate; for the Complex Shaper filter 18 the clock 58 is equal to 2× symbol rate; for CIC 20 the first clock 60 is equal to 2× symbol rate, and the second clock is equal to system clock; for the Up_Converter 22 the clock 64 is equal to system clock; for I Gain block 28 the clock 70 is equal to system clock rate; for Q Gain block 30 the clock 70 is equal to system clock rate; for I DC Offset block 32 the clock 68 is equal to system clock rate; and for Q DC Offset block 34 the clock 69 is equal to system clock rate.

In one embodiment of the present invention, (referring still to FIG. 1), in both BB and PB modes, the I component 12 and Q component 14 of the input signal are processed by the Interpolate_by_2_Nyquist Filter block 16. The Inphase (I) section 100 of the Interpolate_by_2_Nyquist Filter block 16 (of FIG. 1) is depicted in more details in FIG. 2. The Quadrature (Q) section of the Interpolate_by_2_Nyquist Filter block 16 (of FIG. 1) is identical to the I section 100 depicted in FIG. 2. Each filter may be configured up to 61 taps. Each filter is an odd symmetry Finite Impulse Response (FIR) filter that requires 31 coefficients (102, 104, 106, 108, 110, and 112). Each filter section is followed by a programmable gain block to set a precise gain. FIG. 3 shows an adder tree 160 for I Nyquist Filters 100 (of FIG. 2) and for Q Nyquist Filters (not shown).

In one embodiment of the present invention, the coefficients $C_0$ 102 and $C_1$ 104 of MUX 120 selection control, the coefficients $C_2$ 106 and $C_3$ 108 of MUX 122 selection control, and the coefficients $C_{30}$ 110 and $C_0$ 112 of MUX 124 selection control are selected as following.

a) In Baseband (BB) mode or Passband (PB) mode the coeff_sel control signal 14 (of FIG. 2) is toggled at a rate 2× the symbol rate. The rates are as follows:

| | |
|---|---|
| Interpolate by 2 | Toggles every clock; |
| Interpolate by 4 | Toggles every 2 clocks; |
| Interpolate by 8 | Toggles every 4 clocks; |
| Interpolate by 16 | Toggles every 8 clocks; |
| Interpolate by 32 | Toggles every 16 clocks; |
| Interpolate by 64 | Toggles every 32 clocks. | b) The input symbols are synced the same way as before. When the active low sync pulse is detected the interpolation counter is reset. The input symbols are shifted through the delay line at twice the symbol rate also.

c) The multipliers and adders compute on every cycle, however, the results are registered at the output at twice the symbol rate.

d) To minimize the number of gates, the coefficients lengths are selected as follows:

| | |
|---|---|
| $C_{30}$ through $C_{28}$ | Always 2047 |
| $C_{27}$ through $C_{24}$ | +511 to −511 |
| $C_{23}$ through $C_{18}$ | +127 to −127 |
| $C_{17}$ through $C_{10}$ | +31 to −31 |
| $C_9$ through 0 | +7 to −7 | e) The gain for both I and Q sections of the Nyquist filter is calculated as follows:

DC Filter Gain=$2 \times (C_0+C_1+C_2+ \ldots +C_{29})+C_{30}$

The filter output is a 28-bit quantify after the adder tree of FIG. 3. Since the DC gain of the filter for excess bandwidth (BW) between (15–35)% is less than 25 bits, the gain circuit is minimized.

f) As shown in FIG. 3A, the Post-Filter Gain block follows the Nyquist filter block that normalizes the filter gain. As shown in FIG. 4, the Nyquist filter gain is adjusted through a shift block 186 and a multiply block 188.

g) The gain can be fractionally adjusted through a final multiply 190 (of FIG. 4) as follows:

Gain=1.MMMM, whereas MMMM 182 (of FIG. 4) is the 4-bit mantissa value.

In one embodiment of the present invention, FIG. 5 depicts the Clock Generator block 180 (the Clock Generator block 50 of FIG. 1) that generates the system clock 56 for Interpolate_by_2 Nyquist Filter block 16 (of FIG. 1).

Referring still to FIG. 1, the apparatus 10 of the present invention, in both PB and BB modes, comprises a Complex Shaper block 18 configured to pre-compensate the spectrum of the Inphase (I) component and of the Quadrature (Q) component of the signal having the double symbol rate in advance for a spectrum distortion caused by the apparatus 10 and external DACs (Digital-to-Analog Converters).

In one embodiment of the present invention, FIG. 6 illustrates the Complex Shaper further including a programmable Complex Finite Impulse Response (FIR) filter 200 in more details. In this embodiment of the present invention, Complex Finite Impulse Response (FIR) filter 200 includes a Filter block 304 and a Gain block 306. The Filter block 304 of the Complex Shaper Filter further includes a Finite Impulse Response (FIR) filter in the I channel (I_FIR) (202 and 204), and Finite Impulse Response (FIR) filter in the Q channel (Q_FIR) (206 and 208). In this embodiment, the I_FIR filter includes a Shaper Adder Tree 210, and includes a Shaper Adder Tree 212. In this embodiment, the Q_FIR filter includes a Shaper Adder Tree 214, and includes a Shaper Adder Tree 216. A single Shaper Adder Tree 320 that adds outputs 220 through 235 is depicted in FIG. 7 in more details.

In one embodiment of the present invention, FIG. 8 illustrates the Filter block 340 of the Complex Shaper filter in more details. The Filter block 340 of FIG. 8 includes the I_FIR block further including an I×I Shaper Section 342, an I×I Adder Tree Section 344, an I×Q Shaper Section 350, and an I×Q Adder Tree Section 352. In this embodiment, the Filter block 340 of FIG. 8 also includes the Q_FIR filter including a Q×Q Shaper Section 346, a Q×Q Adder Tree Section 348, a Q×I Shaper Section 354, and a Q×I Adder Tree Section 356.

In one embodiment, each I and Q Sections of the Shaping filter 340 (of FIG. 8) are identical with a common set of complex coefficients. In this embodiment, each filter may be configured with up to 31 taps. In this embodiment, each filter is an odd symmetry complex FIR that requires 16 complex coefficients. Each filter section is followed by a gain block to set a precise gain.

In one embodiment, the shaper filter sections calculate as following.

a) In Baseband (BB) mode or Passband (PB) mode the multipliers operate as 2× the symbol rate. The filter also produces an output at the same rate. The rates are as follows:

| | |
|---|---|
| Interpolate by 2 | Compute every clock; |
| Interpolate by 4 | Compute every 2 clocks; |
| Interpolate by 8 | Compute every 4 clocks; |
| Interpolate by 16 | Compute every 8 clocks; |
| Interpolate by 32 | Compute every 16 clocks; |
| Interpolate by 64 | Compute every 32 clocks. | b) The multipliers and adders compute on every cycle, however, the results are registered at the output.

c) The coefficients lengths are as follows:

| | |
|---|---|
| $C_{15}$ through $C_{14}$ | Always 2047 |
| $C_{13}$ through $C_{11}$ | +511 to −511 |
| $C_{10}$ through $C_5$ | +127 to −127 |
| $C_4$ through $C_0$ | +31 to −31 | d) The DC gain of this filter for the I coefficients sections is as follows:

DC Filter Gain=$(2\times(C_0+C_1+C_2+\ldots+C_{14})+C_{15})$

The filter output is a 28-bit quantify after the adder tree (344, 348, 352, and 356 of FIG. 8). The DC gain of the filter for the Q coefficients is always zero for the proprietary algorithm that was used for computing the Q coefficients.

Referring still to FIG. 1, in one embodiment of the present invention, the Complex Shaper block 18 further comprises the programmable Complex Shaper block 340 (of FIG. 8) further including a set of programmable FIR filter coefficients 342, 344, 350, and 354.

In one embodiment of the present invention, the programmable Complex Shaper block 340 (of FIG. 8) further includes an algorithm configured to program a frequency response of the programmable Complex Shaper block. In one embodiment of the present invention, the algorithm comprises at least the following steps:

(1) compute an inverse CIC frequency response;

(2) compute an inverse Digital-to-Analog Converter (DAC) frequency response at a baseband;

(3) multiply the inverse CIC frequency response by the inverse DAC frequency response in order to compute an unlimited bandwidth (BW) Complex Shaper frequency response;

(4) limit a lower and an upper frequency of the unlimited bandwidth (BW) Complex Shaper frequency response to a BW of the Interpolate_by_2_Nyquist Filter; and (5) continue as a linear function the Complex Shaper frequency response beyond the BW of the Interpolate_by_2_Nyquist Filter.

In one embodiment, the BW of the Interpolate_by_2_Nyquist Filter comprises a BW of the carrier controlled by a roll-off factor of the Interpolate_by_2_Nyquist Filter. At a certain critical frequency, called the corner frequency, the response starts to fall off, so that the amplitudes of frequencies in this band are de-emphasized relative to the passband. The rate of fall-off, also called the roll-off, asymptotically approaches a logarithmically-defined constant which for natural systems approximates N*6 dB/octave, where N is the order of the filter system. So, a higher-order filter rolls off more rapidly than a lower-order one. The critical frequency is defined as the frequency at which the response falls 3 dB from flat, i.e. the half-power point.

In one embodiment of the present invention, the step of the algorithm to continue as the linear function the Complex Shaper frequency response beyond the BW of the Interpolate_by_2_Nyquist Filter further includes the step to continue as a linear attenuated function the Complex Shaper frequency response beyond the BW of the Interpolate_by_2_Nyquist Filter (not shown).

Referring still to FIG. 1, in one embodiment of the present invention, in both BB mode and PB mode, the apparatus 10 of the present invention further includes the CIC Interpolator 20. In the baseband (BB) mode, the Cascaded Integrated Comb (CIC) Interpolator filter 20 is configured to increase by an interpolation R factor in the BB mode the sample rate of the signal as compared with a sample rate of the baseband carrier, and configured to output an Inphase (I) component and a Quadrature (Q) component of the interpolated by R signal. On the other hand, in the passband (PB) mode, the CIC Interpolator filter 20 is configured to increase by an interpolation 2R factor the sample rate of the signal as compared with a sample rate of the baseband carrier, and configured to output an Inphase (I) component and a Quadrature (Q) component of the interpolated by 2R signal. R is an integer.

In one embodiment of the present invention, the CIC Interpolator 20 (of FIG. 1) further includes a plurality of CIC difference circuits, and a plurality of Comb filters. More specifically, as shown in FIG. 9, in one embodiment of the present invention, the CIC Interpolator 400 further includes: (a) an integer K-stage difference circuit; and (b) a zero pad block 412. At least one difference circuit further includes an integer N of registers, and a substracter 402. In this embodiment, the CIC Interpolator is clocked at twice the symbol rate, the sample rate is equal to N times the symbol rate, and the zero pad is clocked at 2(N/2−1)/N times the symbol rate. In one embodiment, the zero pad block 450 is depicted in FIG. 10 in more details. In one embodiment, FIG. 11 illustrates the back difference circuit module 500 that uses the control signal 502 to select the number of registers N=1; or N=2.

In one embodiment of the present invention, as shown in FIG. 9, the CIC Interpolator further includes: ©) at least one Comb filter further including an integer M-section cascaded comb filter; and (d) a gain block 424. In one embodiment, at least one section of the M-section cascaded comb filter further includes an integer N of registers, and an adder 414. In one embodiment, the number M of sections in the M-section cascaded comb filter is equal to the number K of stages in the K-stage difference circuit.

In one embodiment of the present invention, the Cascaded Integrated Comb (CIC) Interpolator 400 (of FIG. 9) is configured to increase by an interpolation R factor in the BB mode (and by the interpolation factor 2R in the PB mode) the sample rate of the signal as compared with a sample rate of the baseband carrier. The higher the interpolation factor R is, the easier it is to build a reconstruction filter for the DAC converter because we have a much higher sampling rate if we compare the sample rate of the interpolated by the factor R (or 2R) signal and the sample rate of the baseband carrier.

FIG. 12 illustrates the conventional design of the difference circuit 510. More specifically, the outputs $y_N$ 530 of the conventional circuitry 510 are derived over time as follows:

$$c_N = x_N - x_{N-2} \text{ (Output of stage 1)} \quad (1)$$

$$y_N = c_N - c_{N-2} \text{ (Output of stage 2)} \quad (2)$$

Substituting for $c_N$ and $c_{N-2}$ $$y_N = (x_N - x_{N-2}) - (x_{N-2} - x_{N-4}) \quad (3)$$

$$y_N = x_N - 2x_{N-2} + x_{N-4} \quad (4)$$

FIG. 13 depicts the design of the difference circuit 540 of the present invention with latency. The extra (pipeline) register 546 is inserted between two sections to enable the pipeline computation of the incoming symbols.

More specifically, the outputs $y_N$ 544 of the pipelined circuit are derived over time as follows:

$$c_N = x_N - x_{N-2} \text{ (Output of stage 1)} \quad (5)$$

$$d_N = c_{N-1} \text{ (Output of pipeline register)} \quad (6)$$

$$y_N = d_N - d_{N-2} \text{ (Output of stage 2)} \quad (7)$$

Substituting for $d_N$ $$y_N = c_{N-1} - c_{N-3} \quad (8)$$

Substituting for $C_{N-1}$ and $c_{N-3}$ $$y_N = (x_{N-1} - x_{N-3}) - (x_{N-3} - x_{N-5}) = (x_{N-1} - 2x_{N-3} + x_{N-5}) \quad (9)$$

It follows, that:

$$y_{N+1} = x_N - 2x_{N-2} + x_{N-4} \quad (10)$$

Therefore, the circuit 540 of FIG. 13 is equivalent to the circuit 510 of FIG. 12 except the output is delayed by one sample clock.

Referring still to FIG. 9, in one embodiment of the present invention, the CIC Interpolator 400 includes the K-stage difference circuit having K=5 sections (402–410), the M-cascaded comb filter having an integer M=5 of adder sections (414–422); and the interpolation block R represented by the CIC Gain block 424. Each section of the M-section cascaded adder having the integer N of registers (not shown) adds the interpolated integrated output of the K-stage difference circuit 430 with a combinatorial delay of N samples. The interpolation block R interpolates an output signal of the M-stage adder 440 by the interpolation factor R. Preferably, the number M of cascades in the M-cascaded adder is equal to the number K of parallel difference circuit sections.

In one embodiment, the CIC Interpolator 400 (of FIG. 9) includes a Programmable interpolation filter. Each I and Q section of the Programmable interpolation filter are identical with a common interpolation ratio. In one embodiment, the Programmable interpolation filter is implemented as a cascaded integrated comb filter followed by a gain block for each section to set a precise gain. A table of gains for unity gain operation is given for all interpolation rates.

In one embodiment, the circuitry that implements the CIC Interpolator 20 (of FIG. 1) has to store at least $\log_2 [(RN)]^M$ additional bits (which is equal to the gain growth) as compared with the number of bits in the input digital data signal to avoid overflow; wherein R is an integer. Thus, the price that one pays for the present design of the CIC Interpolator filter is the increased amount of bits that has to be stored in the accumulator register (not shown).

Referring still to FIG. 1, in one embodiment, the apparatus 10 of the present invention further includes a Programmable UP_Converter 22, that is depicted in more details 560 in FIG. 14. The I and Q outputs from either the Nyquist filter or the Programmable Interpolation filter are complex-mixed by a programmable LO output implemented as Numerically Control Oscillator (NCO). The digital up conversion can be up to 0.4 (40%) of the sample rate. The UP_Converter is used in both BB and PB modes, as indicated by the BB/PB control signals (562, 564, 566, and 568). However, in the BB mode, the UP_Converter 560 (of FIG. 14) performs the function of a Phase Shifter 24 (of FIG. 1) and is configured to compensate phase of the interpolated by R signal for a known quadrature error caused by analog components of the outside circuitry. On the other hand, in the PB mode, the Up_Converter 560 (of FIG. 14) performs the up-conversion only.

Referring still to FIG. 1, in one embodiment, the apparatus 10 of the present invention in the BB mode further includes an Inphase (I) channel Gain (I_Gain) block 28 and a Quadrature (Q) channel Gain (Q_Gain) block 30 configured to pre-compensate the I component 72 and the Q component 74 of the interpolated by R signal for a known gain difference between the I and Q channels. On the other hand, in the PB mode embodiment, the Inphase channel Gain block 28 and the Quadrature channel Gain block 30 are set to be equal to one.

FIG. 15 illustrates the I/Q Gain compensation circuitry 580 in more details. When operating in the BB mode, the I and Q outputs from the complex mixer are followed by gain blocks that may have different gains to pre-compensate for know gain differences in the I and Q sections of analog IQ modulator. On the other hand, in the PB mode embodiment, I/Q Gain blocks set the precise gain of the half-complex Up_Converter outputs. In the PB mode embodiment, a table of gains is pre-computed.

Referring still to FIG. 1, in one embodiment, the apparatus 10 of the present invention in the BB mode further includes an I channel DC offset (I_DC_Offset) block 32 and a Q channel DC offset (Q_DC_Offset) block 34. In the BB mode embodiment, the I channel DC offset (I_DC_Offset) block 32 and the Q channel DC offset (Q_DC_Offset) block 34 are configured to pre-compensate the I component and the Q component of the interpolated by R signal for a known DC offset difference between the I channel DC offset and the Q channel DC offset. The I_DC_Offset block is configured to output an I component 36 of the demodulated input signal in the I channel, whereas the Q_DC_Offset block is configured to output a Q component 38 of the demodulated input signal in the Q channel.

FIG. 16 depicts the DC Offset Compensation block 600 in more details. When operating in the BB mode, the I and Q outputs from the I/G Gain error compensation blocks can be biased to pre-compensate for DC offsets within the I/Q modulator. In the PB mode embodiment, the I and Q channel DC offsets are set to be equal to zero.

Referring still to FIG. 1, in one embodiment, the apparatus 10 of the present invention further includes a Controller block (or a Host Interface) 40 provided to configure and to reed-back modulator settings. In one embodiment, the Controller block is implemented using a micro controller.

The Controller block (or a Host Interface) 40 provides the output format control. The output can be configured for 3 modes of operation, baseband mode (BB), passband mode (PB) with dual outputs, or passband (PB) with a single output. When configured for BB operation, the I output is produced at DAC port 0 of the modulator, and the Q output is produced at DAC port 1. When configured for PB operation with dual outputs, two DAC sample outputs are produced for every clock. This allows the modulator to drive the DAC at twice the modulator clock rate. Many DACs are now dual ported to accept even and odd time samples. When configured for PB operation with a single output, only DAC port 0 is used. In all modes the outputs may be configured for offset binary or 2's complement operation.

The foregoing description of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. Therefore, it is intended that the scope of the invention be defined by the claims appended hereto and their equivalents, rather than by the foregoing description. All changes which come within the meaning and range of equivalency of the claims are to be embraced within their scope.

What is claimed is:

1. An apparatus for modulating a digital input signal having a pre-assigned symbol rate and having a baseband carrier frequency by using a single sample clock signal; said pre-assigned symbol rate is selected from the group consisting of a plurality of symbol rates; said apparatus being configured in a baseband mode; said apparatus comprising:

an Interpolate_by__2_Nyquist Filter block configured to double said pre-assigned symbol rate and configured to perform Nyquist filtering operation on said pre-assigned signal having said double symbol rate; and configured to output an Inphase (I) component and a Quadrature (Q) component of said pre-assigned signal having said double symbol rate;

a Complex Shaper block coupled to said Interpolate_by__2_Nyquist Filter block; said Complex Shaper block configured to pre-compensate the spectrum of said Inphase (I) component and of said Quadrature (Q) component of said signal having said double symbol rate in advance for a spectrum distortion caused by said apparatus;

a Cascaded Integrated Comb (CIC) Interpolator filter coupled to said Complex Shaper, said CIC Interpolator configured to increase by an interpolation R factor said sample rate of said signal as compared with a sample rate of said baseband carrier; and configured to output an Inphase (I) component and a Quadrature (Q) component of said interpolated by said factor R signal; R being an integer;

a Phase Shifter coupled to said (CIC) Interpolator filter; said Phase Shifter configured to compensate a phase of said interpolated by R signal for a known quadrature error;

an Inphase (I) channel Gain (I_Gain) block coupled to said Phase Shifter;

a Quadrature (Q) channel Gain (Q_Gain) block coupled to said Phase Shifter;

wherein said I_Gain block and said Q_Gain block are configured to pre-compensate said I component and said Q component of said interpolated by R signal for a known gain difference between said I channel gain and said Q channel gain;

an I channel DC offset (I_DC_Offset) block coupled to said I_Gain block;

a Q channel DC offset (Q_DC_Offset) block coupled to said Q_Gain block;

wherein said I_DC_Offset block and said Q_DC_Offset block are configured to pre-compensate said I component and said Q component of said interpolated by R signal for a known DC offset difference between said I channel DC offset and said Q channel DC offset; and a Controller block configured to supply a plurality of control signals to said apparatus;

wherein said I_DC_Offset block is configured to output an I component of a demodulated input signal in said I channel;

and wherein said Q_DC_Offset block is configured to output a Q component of a demodulated input signal in said Q channel.

2. The apparatus of claim 1, wherein said CIC Interpolator filter further comprises:

a programmable CIC Interpolator filter including a set of programmable CIC Interpolator parameters configured to optimize said interpolation rate R.

3. The apparatus of claim 2, wherein said Complex Shaper block further comprises:

a programmable Complex Shaper block further including a Complex Finite Impulse Response (FIR) filter including a set of programmable FIR filter coefficients.

4. The apparatus of claim 3, wherein said programmable Complex Finite Impulse Response (FIR) filter further includes:

a Finite Impulse Response (FIR) filter in said I channel (I_FIR); said I_FIR filter including two L sets of taps and including two L sets of complex coefficients; L being an integer; said two L sets of complex coefficients further including a first L set of I_I complex coefficients and a second L set of I_Q complex coefficients;

and a Finite Impulse Response (FIR) filter in said Q channel (Q_FIR); said Q_FIR filter including two L sets of taps and including two L sets of complex coefficients; L being an integer; said two L sets of complex coefficients further including a first L set of Q_I complex coefficients and a second L set of Q_Q complex coefficients.

5. The apparatus of claim 4, wherein said I channel coefficients and said Q channel coefficients are symmetrical.

6. The apparatus of claim 4, wherein each said I_I channel coefficients is equal to one said Q_Q channel coefficient; and wherein each said I_Q channel coefficient is equal to one said Q_I channel coefficient.

7. The apparatus of claim 3, wherein said programmable Complex Shaper block further includes:

an algorithm configured to program a frequency response of said programmable Complex Shaper block; said algorithm comprising at least the following steps:

compute an inverse CIC frequency response;

compute an inverse Digital-to-Analog Converter (DAC) frequency response at a baseband;

multiply said inverse CIC frequency response by said inverse DAC frequency response in order to compute an unlimited bandwidth (BW) Complex Shaper frequency response;

limit a lower and an upper frequency of said unlimited bandwidth (BW) Complex Shaper frequency response to a BW of said Interpolate_by__2_Nyquist Filter; wherein said BW of said Interpolate_by__2_Nyquist Filter comprises a BW of said carrier controlled by a roll-off factor of said Interpolate_by__2_Nyquist Filter;

and continue as a linear function said Complex Shaper frequency response beyond said BW of said Interpolate_by__2_Nyquist Filter.

8. The apparatus of claim 7, wherein said step of said algorithm to continue as said linear function said Complex Shaper frequency response beyond said BW of said Interpolate_by__2_Nyquist Filter further includes the step of:

continue as a linear attenuated function said Complex Shaper frequency response beyond said BW of said Interpolate_by__2_Nyquist Filter.

9. The apparatus of claim 1, wherein said CIC Interpolator further includes:

a plurality of CIC difference circuits;

and a plurality of Comb filters.

10. The apparatus of claim 1, wherein said CIC Interpolator further includes:
- an integer K-stage difference circuit, each said difference circuit further including:
  - an integer N of registers; and
  - a subtracter;
  and
- a zero pad block.

11. The apparatus of claim 1, wherein said CIC Interpolator further includes: at least one Comb filter further including:
- an integer M-section cascaded comb filter; and wherein each said section of said M-section cascaded comb filter further includes:
  - an integer N of registers; and
  - an adder;
  and
- a gain block.

12. The apparatus of claim 11, wherein said number M of sections in said M-section cascaded comb filter is equal to said number K of stages in said K-stage difference circuit.

13. The apparatus of claim 11, wherein said CIC Interpolator further includes:
- a plurality of pipeline registers;
- wherein each said pipeline register is configured to perform a pipeline computation on a plurality of input symbols in order to increase the speed of operation of said CIC Interpolator.

14. An apparatus for modulating a digital input signal having a pre-assigned symbol rate and having a baseband carrier frequency by using a single sample clock signal; said pre-assigned symbol rate is selected from the group consisting of a plurality of symbol rates; said apparatus being configured in a passband mode; said apparatus comprising:
- an Interpolate_by_2_Nyquist Filter block configured to double said pre-assigned symbol rate and configured to perform Nyquist filtering operation on said pre-assigned signal having said double symbol rate; and configured to output an Inphase (I) component and a Quadrature (Q) component of said pre-assigned signal having said double symbol rate;
- a Complex Shaper block coupled to said Interpolate_by_2_Nyquist Filter block; said Complex Shaper block configured to pre-compensate the spectrum of said Inphase (I) component and of said Quadrature (Q) component of said signal having said double symbol rate in advance for a spectrum distortion caused by said apparatus;
- a Cascaded Integrated Comb (CIC) Interpolator filter coupled to said Complex Shaper, said CIC Interpolator configured to increase by an interpolation 2R factor said sample rate of said signal as compared with a sample rate of said baseband carrier; and configured to output an Inphase (I) component and a Quadrature (Q) component of said interpolated by 2R signal;
- an UP_Converter coupled to said (CIC) Interpolator filter; said UP_Converter configured to up convert said complex interpolated by 2R signal to a complex signal having an intermediate frequency; said UP_Converter configured to output a real signal having said intermediate frequency; and
- a Controller block configured to supply a plurality of control signals to said apparatus;

wherein in said baseband mode said Inphase channel Gain is set to be equal to One, said Quadrature channel Gain is set to be equal to One, said I channel DC offset is set to be equal to zero, and said Quadrature channel DC offset is set to be equal to zero.

15. The apparatus of claim 14, wherein said CIC Interpolator filter further comprises:
- a programmable CIC Interpolator filter including a set of programmable CIC Interpolator parameters configured to optimize said interpolation rate 2R.

16. The apparatus of claim 15, wherein said Complex Shaper block further comprises:
- a programmable Complex Finite Impulse Response (FIR) filter including a set of programmable FIR filter coefficients.

17. The apparatus of claim 16, wherein said programmable Complex Shaper block further includes:
- an algorithm configured to program a frequency response of said programmable Complex Shaper block; said algorithm comprising at least the following steps:
  - compute an inverse CIC frequency response;
  - compute an inverse Digital-to-Analog Converter (DAC) frequency response at said intermediate frequency;
  - multiply said inverse CIC frequency response by said inverse DAC frequency response to compute an unlimited bandwidth (BW) Complex Shaper frequency response;
  - limit a lower and an upper frequency of said unlimited bandwidth (BW) Complex Shaper frequency response to a BW of said Interpolate_by_2_Nyquist Filter; wherein said BW of said Interpolate_by_2_Nyquist Filter comprises a BW of said carrier controlled by a roll-off factor of said Interpolate_by_2_Nyquist Filter;
  and
  - continue as a linear function said Complex Shaper frequency response beyond said BW of said Interpolate_by_2_Nyquist Filter.

18. The apparatus of claim 17, wherein said step of said algorithm to continue as said linear function said Complex Shaper frequency response beyond said BW of said Interpolate_by_2_Nyquist Filter further includes the step of:
- continue as a linear attenuated function said Complex Shaper frequency response beyond said BW of said Interpolate_by_2_Nyquist Filter.

19. An apparatus for modulating a digital input signal having a pre-assigned symbol rate and having a baseband carrier frequency by using a single sample clock signal; said pre-assigned symbol rate is selected from the group consisting of a plurality of symbol rates; said apparatus being configured in a baseband mode; said apparatus comprising:
- a means for doubling said pre-assigned symbol rate of said digital input signal;
- a means for filtering said digital input signal having said double symbol rate;
- a means for pre-compensating the spectrum of said signal having said double symbol rate in advance for a spectrum distortion caused by said apparatus;
- a means for increasing a sample rate of said signal having said double symbol rate as compared with a sample rate of said baseband carrier;
- a means for compensating a phase of said signal having said increased sample rate for a known quadrature error;

a means for compensating said signal having said increased sample rate for a known gain difference circuit between an I channel gain and a Q channel gain;

a means for compensating said signal having said increased sample rate for a known DC offset difference circuit between said I channel DC offset and said Q channel DC offset;

and a means for supplying a plurality of control signals for said apparatus.

20. An apparatus for modulating a digital input signal having a pre-assigned symbol rate and having a baseband carrier frequency by using a single sample clock signal; said pre-assigned symbol rate is selected from the group consisting of a plurality of symbol rates; said apparatus being configured in a passband mode; said apparatus comprising:

a means for doubling said pre-assigned symbol rate of said digital input signal;

a means for filtering said digital input signal having said double symbol rate;

a means for pre-compensating the spectrum of a signal having said double symbol rate in advance for a spectrum distortion caused by said apparatus;

a means for increasing a sample rate of said signal having said double symbol rate as compared with a sample rate of a baseband carrier;

a means for up converting said signal having said increased sample rate to a complex signal having an intermediate frequency;

and a means for supplying a plurality of control signals for said apparatus;

wherein in said apparatus in said passband mode an Inphase channel Gain is set to be equal to One, a Quadrature channel Gain is set to be equal to One, an I channel DC offset is set to be equal to zero, and a Quadrature channel DC offset is set to be equal to zero.

* * * * *